United States Patent
Mott et al.

(10) Patent No.: US 8,291,198 B2
(45) Date of Patent: Oct. 16, 2012

(54) APPARATUS AND METHOD FOR REGULATING BURSTY DATA IN A SIGNAL PROCESSING PIPELINE

(75) Inventors: Jordan Charles Mott, Allen, TX (US); William Milton Hurley, Murphy, TX (US)

(73) Assignee: Samsung Electronics Co., Ltd., Suwon-Si (KR)

( * ) Notice: Subject to any disclaimer, the term of this patent is extended or adjusted under 35 U.S.C. 154(b) by 1345 days.

(21) Appl. No.: 11/530,706

(22) Filed: Sep. 11, 2006

(65) Prior Publication Data

US 2008/0065866 A1    Mar. 13, 2008

(51) Int. Cl.
*G06F 7/38* (2006.01)
*G06F 9/00* (2006.01)
*G06F 9/44* (2006.01)
*G06F 15/00* (2006.01)

(52) U.S. Cl. ........................................ 712/220

(58) Field of Classification Search .................. 712/220
See application file for complete search history.

(56) References Cited

U.S. PATENT DOCUMENTS 4,761,763 A * 8/1988 Hicks ............................ 710/106
6,198,785 B1 * 3/2001 Flynn ............................ 375/377

* cited by examiner

*Primary Examiner* — Corey S Faherty

(57) ABSTRACT

Apparatus and method for regulating data in a signal processing pipeline are disclosed. For example, an apparatus is disclosed that includes a first element operable to determine a time interval between a first plurality of data samples input to the signal processing pipeline, and calculate a sample spacing count value associated with the time interval, a second element coupled to the first element, the second element operable to hold the sample spacing count value until the time interval between the first plurality of data samples is changed, a third element coupled to the second element and the signal processing pipeline, the third element operable to output a control signal to the signal processing pipeline, and responsive to the control signal, the signal processing pipeline operable to output a second plurality of data samples.

20 Claims, 2 Drawing Sheets

APPARATUS AND METHOD FOR REGULATING BURSTY DATA IN A SIGNAL PROCESSING PIPELINE

FIELD OF THE INVENTION

The invention relates to the signal processing field, and more particularly, but not exclusively, to an apparatus and method for regulating bursty data in a signal processing pipeline.

BACKGROUND OF THE INVENTION

Efficiency and flexibility are important tools in the hands of signal processing engineers who design the latest generation wireless communication handsets. Each dollar saved by reducing silicon area and maximizing design reuse is a dollar that can be applied to profit and the manufacturer's bottom line. In that regard, simplifying design interfaces and minimizing interaction between electronic components results in cost savings such as reduced silicon area, power requirements, and design time.

One area where such cost savings can be realized is in the design of signal processing pipelines. A primary function of signal processing pipelines is to change data rates as the data is being conveyed through the pipeline. For example, in certain rate-changing filter pipelines, the incoming data is down-converted and interpolated. When pipeline interpolation is performed, a conventional technique used to prevent a downstream element from being overwhelmed by increased data rates is to buffer the data in the pipeline with a memory interface device. A typical memory interface device used to buffer data in a signal processing pipeline is a First-In First-Out (FIFO) memory device, which allows each element in the pipeline to source or accept data at its own rate. An example of a conventional interpolation signal processing pipeline with such a FIFO buffer device is shown in FIG. 1.

FIG. 1 depicts a simplified block diagram of a conventional interpolating filter signal processing pipeline 100, which illustrates the use of a FIFO memory element as a buffer device. Referring to FIG. 1, pipeline 100 includes an interpolating element 102, a memory (FIFO) storage element 104, and a receiving element 106. Note that a first clock line 108a is provided to clock incoming data into the memory element 104 at a rate compatible with that of the interpolating element 102, and a second clock line 108b is provided to clock data out of the memory element 104 at a rate compatible with that of the receiving element 106.

The disadvantages of existing signal processing pipelines are known. For example, the memory elements (e.g., FIFOs) typically used as buffers consume a substantial amount of silicon for the control logic and storage circuitry involved. In this regard, a relatively complex control interface is needed to enable both pipeline elements 102 and 106 to access the memory storage array (104). For systems with multiple data rates (e.g., each data rate associated with a different communication protocol), the memory element in the pipeline has to be sized in such a way that it can handle the largest predicted data influx. However, if a new pipeline design is envisioned with different technical requirements, the memory element typically has to be redesigned. Consequently, in that case, the entire signal processing pipeline circuit has to be redesigned. The increased development costs incurred as a result of such a redesign are disadvantageous particularly for cost sensitive applications.

SUMMARY OF THE INVENTION

In one embodiment, an apparatus is provided for regulating data in a signal processing pipeline. The apparatus includes a first element operable to determine a time interval between a first plurality of data samples input to the signal processing pipeline, and calculate a sample spacing count value associated with the time interval, a second element coupled to the first element, the second element operable to hold the sample spacing count value until the time interval between the first plurality of data samples is changed, a third element coupled to the second element and the signal processing pipeline, the third element operable to output a control signal to the signal processing pipeline, and responsive to the control signal, the signal processing pipeline operable to output a second plurality of data samples.

In a second embodiment, an apparatus for smoothing bursty data in a signal processing pipeline is provided. The apparatus includes means for determining a time interval between a first plurality of data samples input to the signal processing pipeline, means for calculating a sample spacing count value associated with the time interval, means coupled to the means for determining and calculating, for holding the sample spacing count value until the time interval between the first plurality of data samples is changed, means coupled to the means for holding, for outputting a control signal to the signal processing pipeline, and means for outputting a second plurality of data samples from the signal processing pipeline responsive to the control signal.

In a third embodiment, an apparatus for controlling data traffic through a signal processing pipeline is provided. The apparatus includes a dynamic iterative division element operable to determine a period for a first plurality of data samples input to the signal processing pipeline, and calculate a sample spacing count value associated with the period, a temporary storage device coupled to the dynamic iterative division element, the temporary storage device operable to hold the sample spacing count value until at least one of an interpolation count value and the period is changed, a comparator coupled to the temporary storage device and the signal processing pipeline, the comparator operable to output a control signal to the signal processing pipeline, and responsive to the control signal, the signal processing pipeline operable to output a second plurality of data samples.

In a fourth embodiment, a method for controlling data in a signal processing pipeline is provided. The method includes the steps of determining a time interval between a first plurality of data samples input to the signal processing pipeline, calculating a sample spacing count value associated with the time interval, storing the sample spacing count value until at least one of a time interval between the first plurality of data samples and a value associated with a function of the signal processing pipeline is changed, outputting a control signal to the signal processing pipeline, the control signal associated with the sample spacing count value, and responsive to the control signal, the signal processing pipeline outputting a second plurality of data samples.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1:
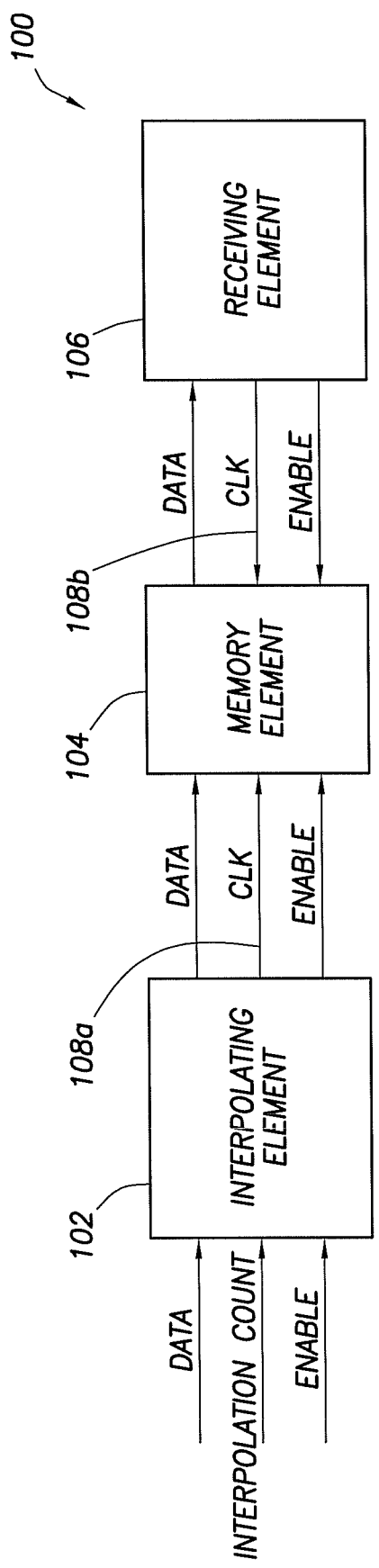
FIG. 1 depicts a simplified block diagram of a conventional interpolating filter signal processing pipeline, which illustrates the use of a FIFO memory element as a buffer device.
Figure 2:
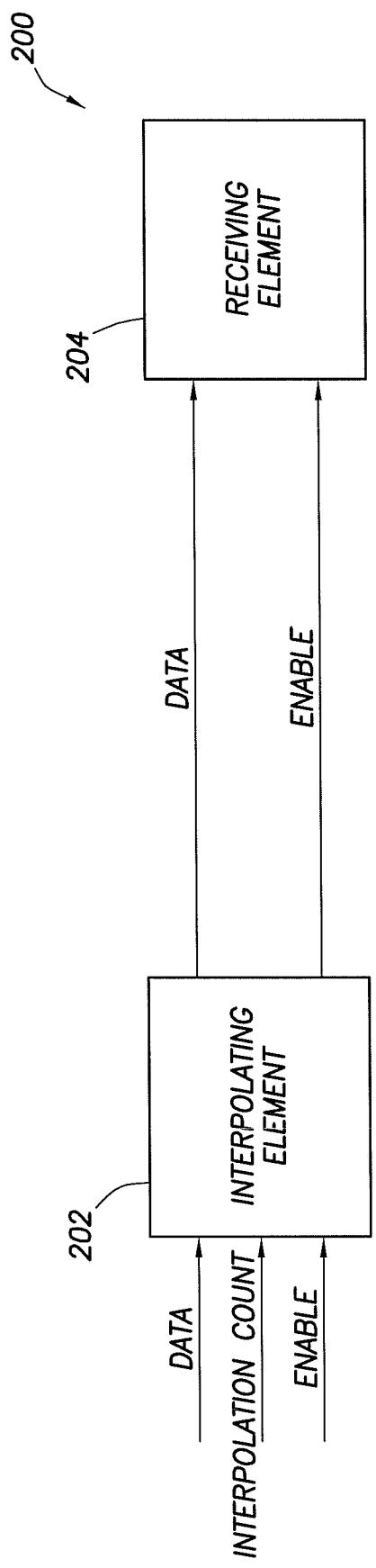
FIG. 2 depicts an example signal processing pipeline, which illustrates an example use of the present invention for an interpolating filter pipeline.

In one embodiment, the present invention provides an apparatus that dynamically controls or regulates bursty data traffic in a signal processing pipeline, which can be implemented without the use of a rate smoothing memory storage device. An example of such a signal processing pipeline is the interpolating filter pipeline 200 depicted in FIG. 2. As illustrated by pipeline 200 depicted in FIG. 2, an interpolating element 202 and receiving element 204 are shown, but no memory element or similar buffer device is shown. Essentially, the present invention provides an active element in a signal processing pipeline, which dynamically calculates the number of clock periods needed for equidistant spacing of the output data samples. Thus, the present invention provides a signal processing pipeline that includes a more generic data/data enable handshake interface element as a substitute for the more complicated and costly memory type interface elements currently being used.

Figure 3:
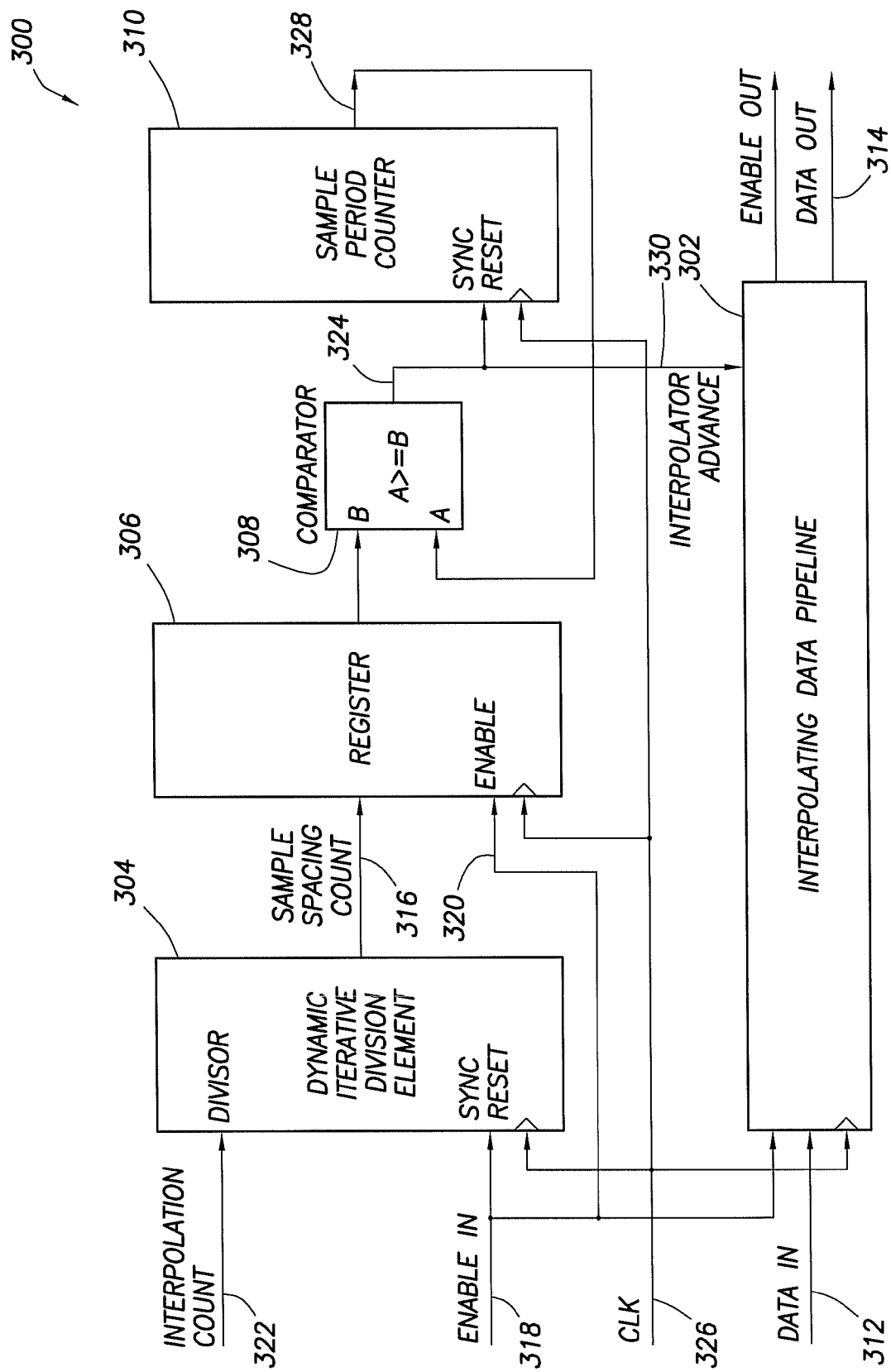
FIG. 3 depicts a simplified block diagram of an apparatus for controlling or regulating bursty data in a signal processing pipeline, which can be used to implement a preferred embodiment of the present invention.

With reference now to FIG. 3, a simplified block diagram of an apparatus 300 for controlling or regulating bursty data in a signal processing pipeline is shown, which can be used to implement a preferred embodiment of the present invention. For this example embodiment, apparatus 300 dynamically controls an interpolating data pipeline 302. However, the present invention is not intended to be so limited and can be used to control, regulate or smooth the rate of bursty data in any suitable signal processing pipeline such as, for example, pipelines for processing mathematical functions, hardware dividers, lookup tables, and similar other elements or devices that process bursty data (e.g., packet data, frame data, streaming data, etc.) that needs to be controlled, regulated and/or smoothed.

For this example embodiment, apparatus 300 includes a dynamic iterative division element (DIDE) 304, a register element 306 to temporarily hold (store) the output of DIDE 304, a comparator element 308 coupled to the output connection of register 306, and a sample period counter element 310 coupled to the output connection of comparator 308. An interpolation count signal 322 is input to the divisor input connection of DIDE 304, an enable in signal 318 is input to the sync reset connection of DIDE 304, and a clock signal 326 is input to the clock input connection of DIDE 304. The enable in signal 318 is also coupled to the interpolating data pipeline 302, and an enable input connection 320 of register 306. The clock signal 326 is also input to the respective clock input connections of the interpolating data pipeline 302, register 306, and sample period counter 310.

The output of register 306 is connected to the "B" input connection of comparator 308, and the output connection 328 of the sample period counter 310 is connected to the "A" input connection of comparator 308. For this example embodiment, a signal is output at connection 324 of comparator 308 if the signal at the "A" input is greater than or equal to the signal at the "B" input. The output connection 324 of comparator 308 is connected to the sync reset connection of sample period counter 310, and also to the interpolator advance input connection 330 of interpolating data pipeline 302.

In operation, for this example embodiment, a primary function of DIDE 304 is to measure the period between the incoming samples (at data in connection 312), and calculate the number of clock periods needed to insert between each interpolated output sample (at data out connection 314). Essentially, DIDE 304 accomplishes this function using a logic function (and/or executing a suitable software algorithm), which enables a sample spacing count 316 to occur (at the output of DIDE 304) only after a modulo-interpolation count (based on the interpolation counts 322) has reached its terminal value. Thus, in order to output a sample spacing count 316, DIDE 304 performs the following calculation: Sample Spacing Count=Truncation(# of clocks between each sample/interpolation count). Notably, DIDE 304 can perform this calculation without the use of a separate hardware divider element, which is a highly cost-effective and space-efficient approach.

The calculated Sample Spacing Count values from DIDE 304 are reset synchronously whenever there is an indication that a new sample has been received (e.g., signal at the Enable In connection 318). As such, DIDE 304 operates at the same clock rate as the interpolating data pipeline 302. The sample spacing count 316 at the output of DIDE 304 is captured in an interface register 306 when the next indication is received (e.g., input at enable in connection 320) that an input sample period has been completed. It may be assumed that the period between data samples is a consistent value for a predefined period of time. Therefore, it may also be assumed that the sample spacing count value held in register 306 is constant for this period as well. However, the sample spacing count value in register 306 will change when a different interpolation count is received (at interpolation count input connection 322), or the period between samples is changed. In any event, changes in the sample spacing count 316 will take effect after receipt of the first sample pair following a reconfiguration of the interpolating element involved (e.g., interpolating data pipeline 302 in this example embodiment) or input sample rate change.

The comparator 308 functions primarily to constrain the output value of the sample period counter 310 in order to produce a modulo-sample spacing count counter. As such, the signal at the output connection 324 of comparator 308 synchronously resets the sample period counter 310, and is also used as a control signal to advance data through the interpolating data pipeline 302 (e.g., at interpolator advance connection 330). Each time this interpolator advance control signal (330) is active (signal from output connection 324), the next data sample is provided at the data out connection 314 of interpolating data pipeline 302.

In this example embodiment, the present invention limits the advance of the interpolating data pipeline. Therefore, the buffer device typically located in conventional pipelines between the interpolating element and the receiving element can be eliminated, because the downstream receiving element can receive data in a time-distributed fashion instead of a periodic burst. The actual period of the output data samples from the interpolating data pipeline can be predefined by specifying the interpolation count and the clock rate in the receiving element.

Additionally, as illustrated by the example embodiment shown in FIG. 3, the present invention eliminates the need for a buffer element between an interpolating element and a receiving element in the signal processing pipeline, which results in reduced silicon area and minimized complexity in the interface design. Also, the present invention provides a more flexible interpolating element that is more adaptable to new algorithmic designs, and which reduces development costs, enables the reuse of existing processing devices in new products, and thus minimizes time to market. More broadly, the present invention provides an approach in which data being generated in a data pipeline from samples already present in the pipeline can be presented to a downstream element in a controlled way. In this manner, the present invention provides an approach that controls and/or regulates bursty data in signal processing pipelines.

The description of the present invention has been presented for purposes of illustration and description, and is not intended to be exhaustive or limited to the invention in the form disclosed. Many modifications and variations will be apparent to those of ordinary skill in the art. These embodiments were chosen and described in order to best explain the principles of the invention, the practical application, and to enable others of ordinary skill in the art to understand the invention for various embodiments with various modifications as are suited to the particular use contemplated.

What is claimed is:

1. An apparatus configured to regulate data in a signal processing pipeline, the apparatus comprising:
    a first element configured to determine a time interval between a first plurality of data samples inputted to the signal processing pipeline, and calculate a sample spacing count value associated with the time interval after a modulo-interpolation count has reached a terminal value;
    a second element coupled to the first element, the second element configured to hold the sample spacing count value until the time interval between the first plurality of data samples has changed;
    a third element coupled to the second element and the signal processing pipeline, the third element configured to output a control signal to the signal processing pipeline to advance data through the signal processing pipeline when a sample period count value associated with the time interval is greater than or equal to the sample spacing count value.

2. The apparatus of claim 1, further comprising a sample period counter element coupled to the third element, the sample period counter element including an output connected to an input of the third element and configured to generate the sample period count value.

3. The apparatus of claim 1, wherein the signal processing pipeline comprises at least one of an interpolating filter pipeline, a pipeline for processing mathematical functions, a hardware divider pipeline, and a pipeline for processing lookup table data.

4. The apparatus of claim 1, wherein the first element comprises a dynamic iterative division element.

5. The apparatus of claim 1, wherein the second element comprises a register.

6. The apparatus of claim 1, wherein the third element comprises a comparator.

7. The apparatus of claim 1, wherein the first element is configured to calculate the sample spacing count value by dividing a number of clock periods between each inputted data sample by a count associated with a function of the signal processing pipeline.

8. The apparatus of claim 1, wherein the first element is configured to calculate the sample spacing count value by dividing a number of clock periods between each inputted data sample by an interpolation count.

9. An apparatus configured to smooth bursty data in a signal processing pipeline, the apparatus comprising:
    means for determining a time interval between a first plurality of data samples inputted to the signal processing pipeline;
    means for calculating a sample spacing count value associated with the time interval after a modulo-interpolation count has reached a terminal value;
    means for holding the sample spacing count value until the time interval between the first plurality of data samples has changed, the mean for holding coupled to the means for determining and calculating;
    means for outputting a control signal to the signal processing pipeline to advance data through the signal processing pipeline responsive to the control signal when a sample period count value associated with the time interval is greater than or equal to the sample spacing count value, the means for outputting coupled to the means for holding.

10. The apparatus of claim 9, further comprising:
    means for counting a sample period, the means for counting coupled to the means for outputting.

11. The apparatus of claim 9, wherein the means for calculating comprises means for dividing a number of clock periods between a plurality of data samples by an interpolation count value.

12. The apparatus of claim 9, wherein the means for determining and the means for calculating comprise a dynamic iterative division element.

13. An apparatus configured to control data traffic through a signal processing pipeline, the apparatus comprising:
    a dynamic iterative division element configured to determine a period for a first plurality of data samples inputted to the signal processing pipeline, and calculate a sample spacing count value associated with the period after a modulo-interpolation count has reached a terminal value;
    a temporary storage device coupled to the dynamic iterative division element, the temporary storage device configured to hold the sample spacing count value until at least one of an interpolation count value and the period is changed; and
    a comparator coupled to the temporary storage device and the signal processing pipeline, the comparator configured to output a control signal to advance data through the signal processing pipeline when a sample period count value associated with the time interval is greater than or equal to the sample spacing count value.

14. The apparatus of claim 13, further comprising a sample period counter coupled to the comparator.

15. The apparatus of claim 13, wherein the apparatus comprises a plurality of logic devices.

16. A method for controlling data in a signal processing pipeline, comprising the steps of:
   determining a time interval between a first plurality of data samples inputted to the signal processing pipeline;
   calculating a sample spacing count value associated with the time interval after a modulo-interpolation count has reached a terminal value;
   storing the sample spacing count value until at least one of a time interval between the first plurality of data samples and a value associated with a function of the signal processing pipeline is changed; and
   outputting a control signal to the signal processing pipeline to advance data through the signal processing pipeline when a sample period count value associated with the time interval is greater than or equal to the sample spacing count value.

17. The method of claim 16, further comprising comparing the sample spacing count value with a sample period count value.

18. The method of claim 16, wherein the signal processing pipeline comprises at least one of an interpolating filter pipeline, a pipeline for processing mathematical functions, a hardware divider pipeline, and a pipeline for processing lookup table data.

19. The apparatus of claim 8, wherein the interpolation count is obtained from an input signal.

20. The apparatus of claim 13, wherein the modulo-interpolation count is calculated according to an interpolation count input signal.

* * * * *

UNITED STATES PATENT AND TRADEMARK OFFICE
CERTIFICATE OF CORRECTION

| | | |
|---|---|---|
| PATENT NO. | : 8,291,198 B2 | Page 1 of 1 |
| APPLICATION NO. | : 11/530706 | |
| DATED | : October 16, 2012 | |
| INVENTOR(S) | : Mott et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1471 days.

Signed and Sealed this
Twenty-sixth Day of August, 2014

Michelle K. Lee
*Deputy Director of the United States Patent and Trademark Office*